United States Patent
Wu et al.

(10) Patent No.: US 11,778,765 B2
(45) Date of Patent: Oct. 3, 2023

(54) ELECTRONIC DEVICE AND ADAPTOR CARD THEREOF

(71) Applicant: WISTRON NEWEB CORPORATION, Hsinchu (TW)

(72) Inventors: Tsung-Han Wu, Hsinchu (TW); Yu-Shuo Wu, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 59 days.

(21) Appl. No.: 17/399,237

(22) Filed: Aug. 11, 2021

(65) Prior Publication Data
US 2022/0400568 A1 Dec. 15, 2022

(30) Foreign Application Priority Data
Jun. 10, 2021 (TW) ................................ 110121099

(51) Int. Cl.
H05K 5/00 (2006.01)
H05K 5/02 (2006.01)
H05K 7/14 (2006.01)
H05K 7/20 (2006.01)

(52) U.S. Cl.
CPC ......... H05K 5/0282 (2013.01); H05K 7/1452 (2013.01); H05K 7/20127 (2013.01); *H05K 5/0269* (2013.01)

(58) Field of Classification Search
CPC .. H05K 5/0282; H05K 5/0269; H05K 7/1452; H05K 7/20127
USPC ........................................................ 361/737
See application file for complete search history.

(56) References Cited

U.S. PATENT DOCUMENTS

| 10,624,233 | B1* | 4/2020 | Huang | H05K 7/20727 |
| 2004/0031767 | A1* | 2/2004 | Ice | H05K 7/1404 |
| | | | | 211/41.17 |
| 2005/0148222 | A1* | 7/2005 | Kamata | H01R 13/6335 |
| | | | | 439/159 |
| 2008/0117589 | A1* | 5/2008 | Carrera | G06F 1/20 |
| | | | | 165/59 |
| 2012/0224325 | A1* | 9/2012 | Sun | H05K 7/20145 |
| | | | | 361/695 |

FOREIGN PATENT DOCUMENTS

WO WO-2022068303 A1 * 4/2022 ............... H05K 7/20

* cited by examiner

*Primary Examiner* — Anatoly Vortman
*Assistant Examiner* — Zhengfu J Feng
(74) *Attorney, Agent, or Firm* — McClure, Qualey & Rodack, LLP

(57) ABSTRACT

An electronic device is provided. The electronic device includes a housing having an insertion slot, a connecting interface, and an adaptor card. The connecting interface is disposed in the housing for connecting with a first electronic module or a second electronic module separately and has a first connecting part and a second connecting part. The adaptor card is detachably disposed in the housing and includes a flow guide. When the electronic device is in a first mode, the first electronic module is connected to the first connecting part, and the adaptor card is disposed between the insertion slot and the connecting interface. The flow guide directs an airflow toward the first electronic module. When the electronic device is in a second mode, the adaptor card is removed from the housing, and the second electronic module is connected to the first connecting part and the second connecting part.

8 Claims, 12 Drawing Sheets

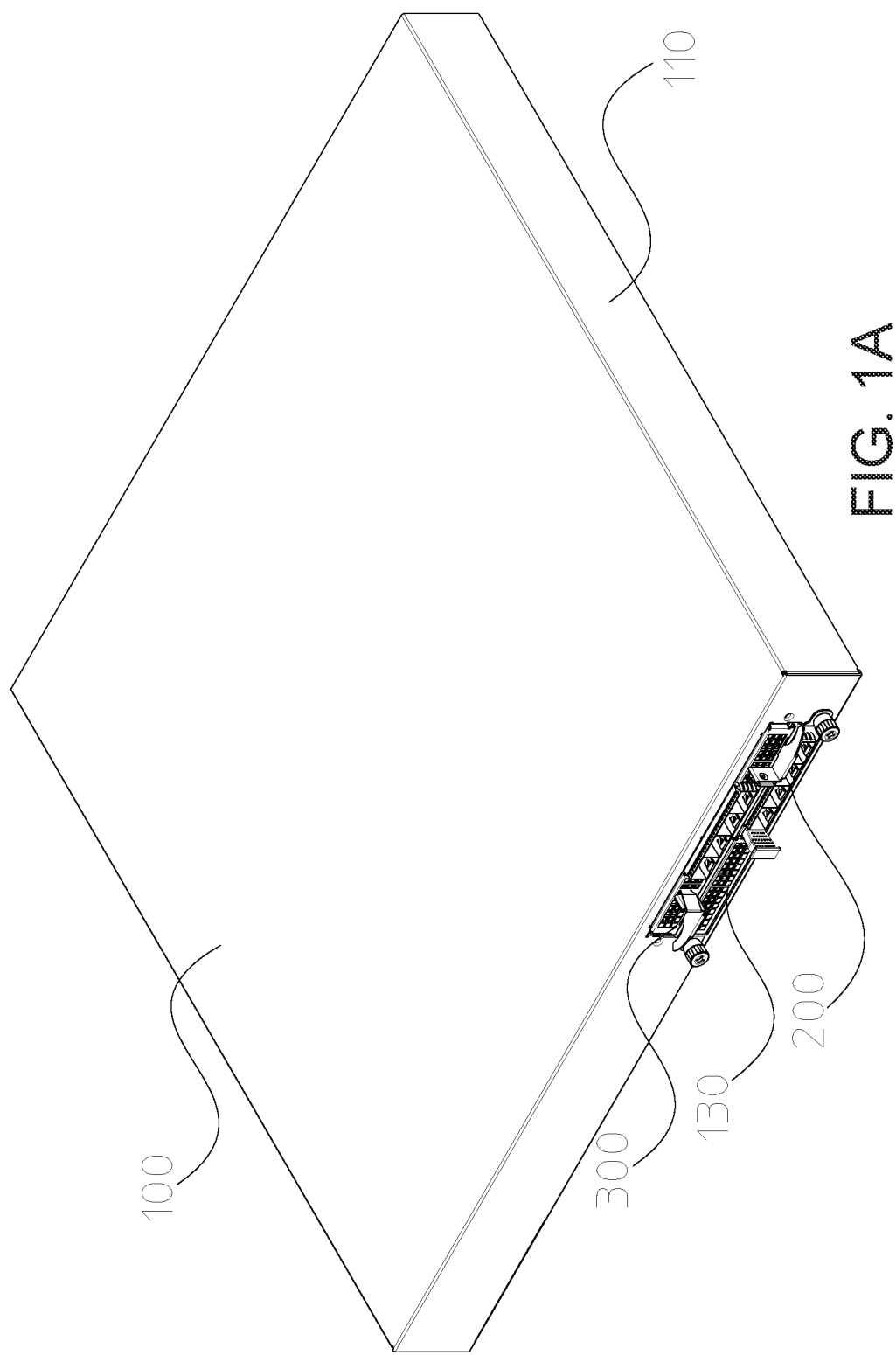

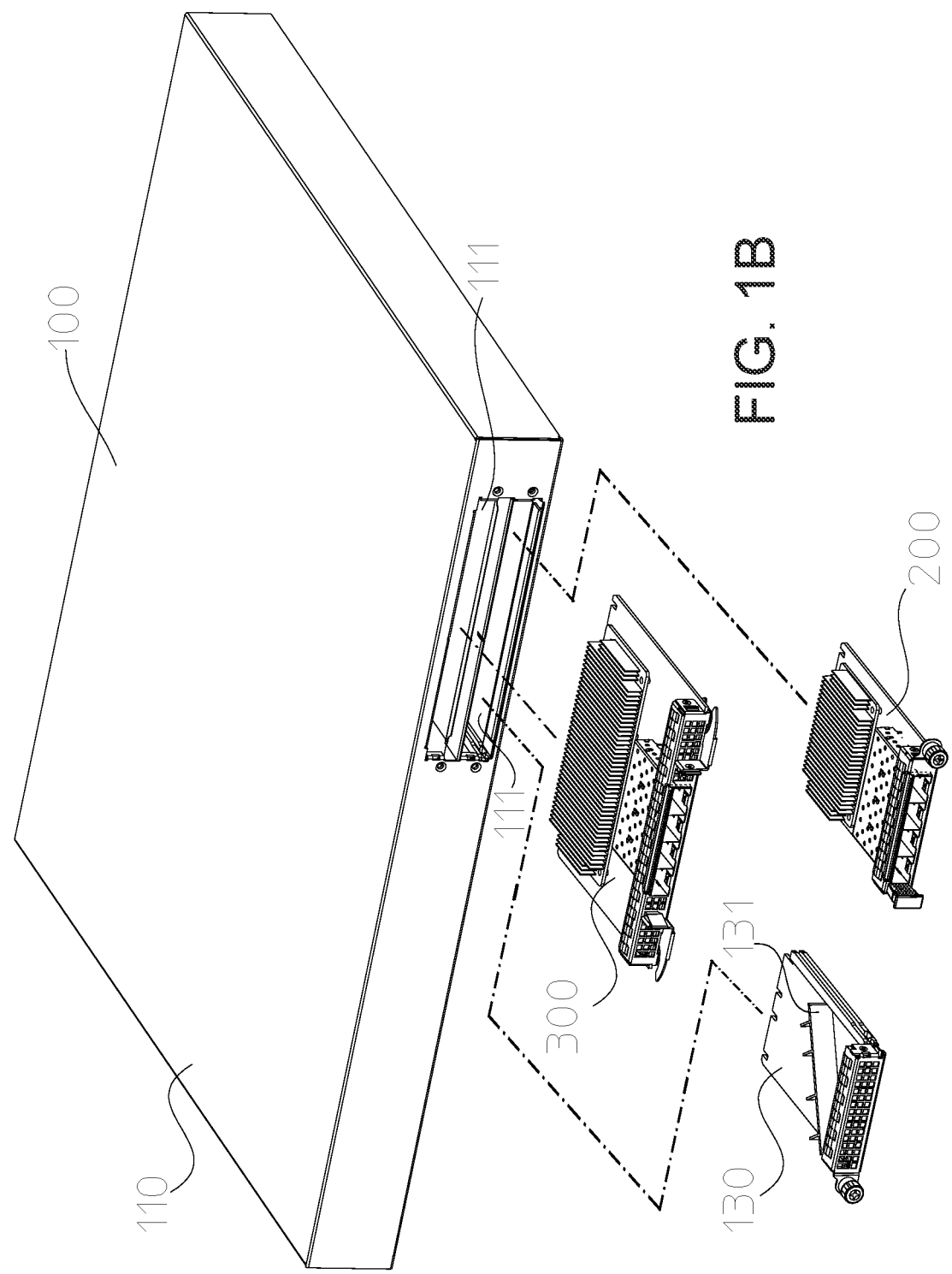

ELECTRONIC DEVICE AND ADAPTOR CARD THEREOF

CROSS-REFERENCE TO RELATED PATENT APPLICATION

This application claims the benefit of priority to Taiwan Patent Application No. 110121099, filed on Jun. 10, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device with two operating modes and an adaptor card thereof, and more particularly, to an electronic device that uses the adaptor card to receive electronic modules of different sizes separately in the same insertion slot and at the same time, uses the flow guiding function of the adaptor card to lower the temperature of the electronic module during operation.

BACKGROUND OF THE DISCLOSURE

Most of the electronic devices like routers, switches, servers are designed to have expansion slots for electronic modules such as network interface modules, so that users are able to expand the product functionality by adding extra electronic modules. However, electronic modules of the same functionality may have different sizes. Take network interface module (NIM) as an example, they come in two sizes, small form factor (SFF) and large form factor (LFF). Besides the difference in size, SFF module corresponds to one Peripheral Component Interconnect Express (PCIe) slot, and LFF module corresponds to two PCIe slots. The expansion slots of current electronic devices on the market support only one size type of the electronic modules, which means the user cannot pick whichever type of electronic modules they want.

Even if the user places an electronic module of a different size in the expansion slot of the electronic device, the installation would be difficult due to the structural design of the expansion slot in the electronic device, and so the electronic module could not be properly installed or connected to the corresponding connector.

SUMMARY OF THE DISCLOSURE

In response to the above-referenced technical inadequacies, the present disclosure provides an electronic device and an adaptor card thereof, wherein the electronic device uses the adaptor card to receive electronic modules of different sizes separately in the same insertion slot, which increases flexibility for the user to select desired electronic modules, and the flow guiding function of the adaptor card can lower the temperature of the electronic module in the electronic device during operation.

An object of the present disclosure is to provide an electronic device that includes a housing, a connecting interface, and an adaptor card. The housing has an insertion slot. The connecting interface is disposed in the housing for connecting to a first electronic module or a second electronic module separately and includes a first connecting part and a second connecting part. The adaptor card is detachably disposed in the housing and includes a flow guide. When the electronic device is in a first mode, the first electronic module is disposed in the housing through the insertion slot and connected to the first connecting part of the connecting interface, and the adaptor card is disposed between the insertion slot and the second connecting part, wherein the flow guide of the adaptor card directs an airflow toward the first electronic module. When the electronic device is in a second mode, the adaptor card is removed from the housing through the insertion slot, and the second electronic module is disposed in the housing through the insertion slot and connected to the first connecting part and the second connecting part of the connecting interface.

Another object of the present disclosure is to provide an adaptor card that is suitable for use in an electronic device having an insertion slot and a connecting interface. The adaptor card includes a card body and a flow guide disposed on the card body. The adaptor card enters the electronic device through the insertion slot, and the flow guide is used to direct an airflow toward an electronic module that is disposed in the electronic device through the insertion slot and connected to the connecting interface.

As aforementioned, the electronic device and the adaptor card thereof provided by the present disclosure direct airflow toward an electronic module in operation through the flow guide structure of the adaptor card. Therefore, by utilizing the adaptor card, electronic modules of different sizes can be easily installed in the one-size insertion slot of the electronic device, and the combination of the adaptor card and the electronic module dissipates heat more efficiently, thereby lowering the temperature of the electronic device as a whole. Hence, the range of electronic modules that can be used in the same electronic device is extended, and the goal to increase the flexibility in user selection is met.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1A is a schematic diagram of an electronic device in operation according to an embodiment of the present disclosure;

FIG. 1B is a schematic diagram of an electronic device not in operation according to an embodiment of the present disclosure;

DETAILED DESCRIPTION OF THE EXEMPLARY EMBODIMENTS

Figure 2:
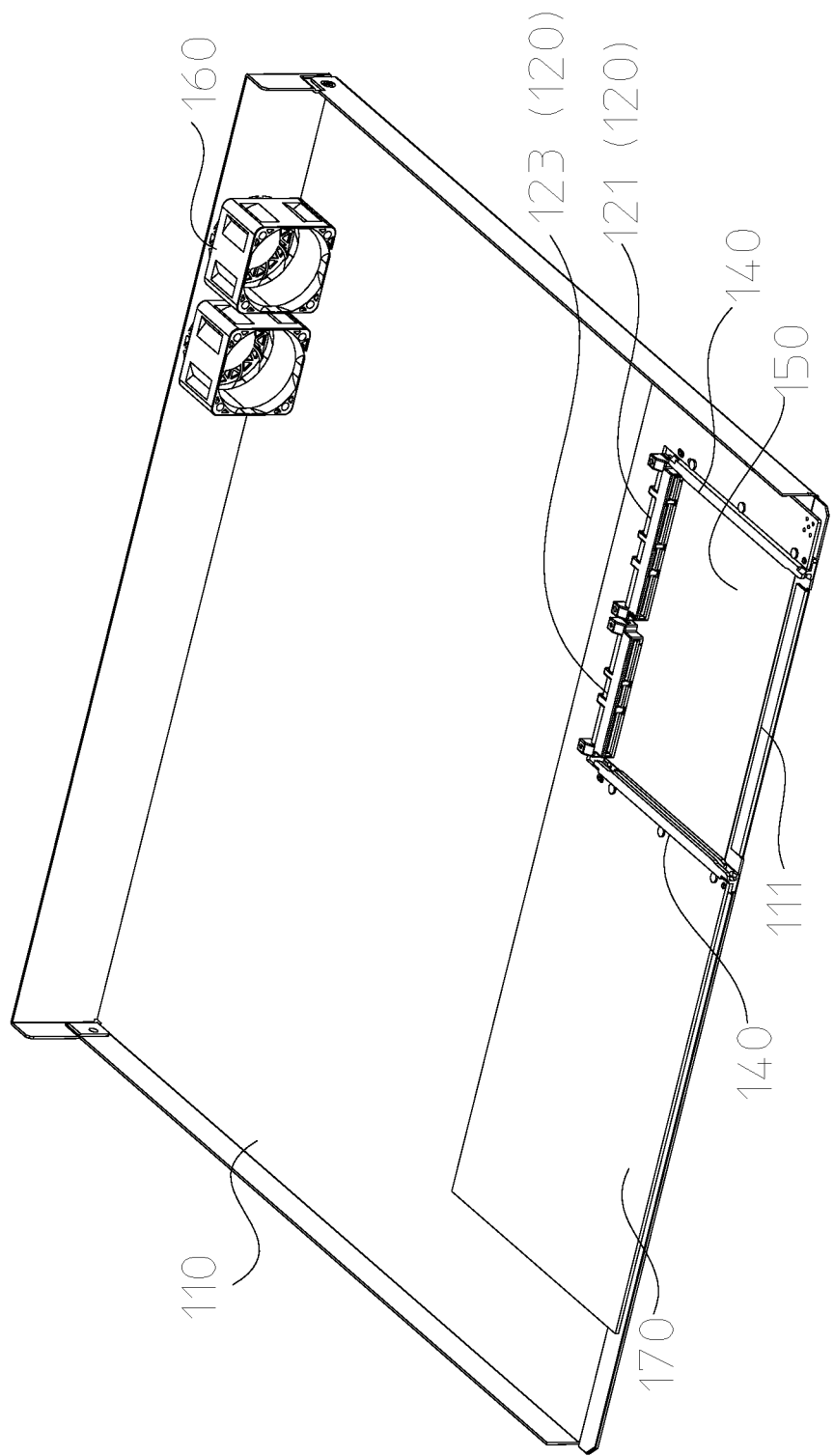
FIG. 2 is a schematic diagram of an electronic device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIGS. 1A, 1B, and 2, an electronic device 100 according to an embodiment of the present disclosure mainly includes a housing 110, a connecting interface 120, and an adaptor card 130. The electronic device 100 has two operating modes in which a first electronic module 200 and a second electronic module 300 of difference sizes are respectively accommodated. The housing 110 has an insertion slot 111, wherein the first electronic module 200, the second electronic module 300, and the adaptor card 130 are placed in and removed from the electronic device 100 through the insertion slot 111. The connecting interface 120 is disposed in the housing 110 for connecting to the first electronic module 200 and the second electronic module 300 and includes a first connecting part 121 and a second connecting part 123. The adaptor card 130 is detachably disposed in the housing 110 and includes a flow guide 131.

The electronic device 100 further includes two guiding rails 140 disposed respectively at two sides of the insertion slot 111, for example left side and right side, and extending toward the connecting interface 120. The insertion slot 111, the two guiding rails 140, and the connecting interface 120 together encircle and form an accommodating space 150. In this embodiment, the two guiding rails 140 extend to two sides of the connecting interface respectively, for example left side and right side, and are parallel to each other. In other words, two ends of each guiding rail 140 are located respectively at one side of the insertion slot 111 and one side of the connecting interface 120, and the sides are on the same side, for example both are left sides or both are right sides, so that the accommodating space 150 is a rectangular space, but the present disclosure is not limited thereby.

In specific, the connecting interface 120 and the two guiding rails 140 are disposed on a carrier board 170, and the carrier board 170 is disposed in the housing 110. The carrier board 170 is, for example but not limited to, a printed circuit board (PCB).

When the electronic device 100 is in a first mode, the accommodating space 150 accommodates the adaptor card 130 and the first electronic module 200, and when the electronic device is in a second mode, the accommodating space 150 accommodates only the second electronic module 300.

Figure 3:
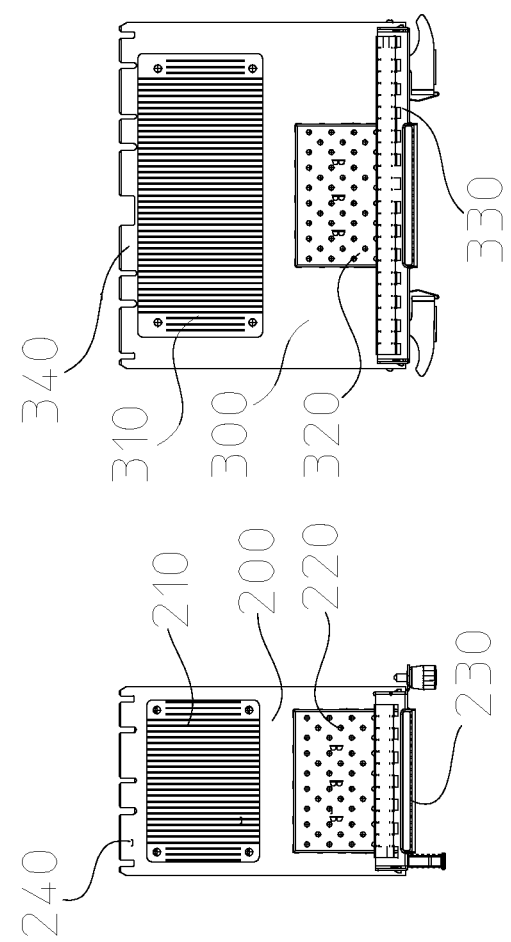
FIG. 3A is a top view of a first electronic module.
FIG. 3B is a top view of a second electronic module.

As shown in FIGS. 3A and 3B, the first electronic module 200 and the second electronic module 300 are electronic card connectors that are approximately rectangular-shaped. A cover member 230, 330 is disposed at one end of each electronic card connector, and the other end opposite thereto is a connecting end 240, 340 having specific shape. The first electronic module 200 differs from the second electronic module 300 not only in size, but also in the specific shape of their connecting ends 240, 340. For example, the specific shapes of the connecting ends 240, 340 correspond to one of or the combination of the first connecting part 121 and the second connecting part 123 of the connecting interface 120. In this embodiment, the specific shape of the connecting end 240 of the first electronic module 200 corresponds to the first connecting part 121, and the specific shape of the connecting end 340 of the second electronic module 300 corresponds to the first connecting part 121 and the second connecting part 123, but the present disclosure is not limited thereby.

Generally, heat is generated during the operation of the electronic module 200, 300, and so the electronic module 200, 300 is usually equipped with some heat dissipation units 210, 310 such as thermal interface material. Also, a bracket 220, 320 and the cover member 230, 330 disposed on the electronic module 200, 300 are designed to have holes for increasing airflow. Through the heat dissipation unit 210, 310 and the holes on the bracket 220, 320 and the cover member 230, 330, a fan 160 in the electronic device 100 is able to quickly remove the heat from the electronic module 200, 300, and good heat dissipation is achieved.

Figure 4:
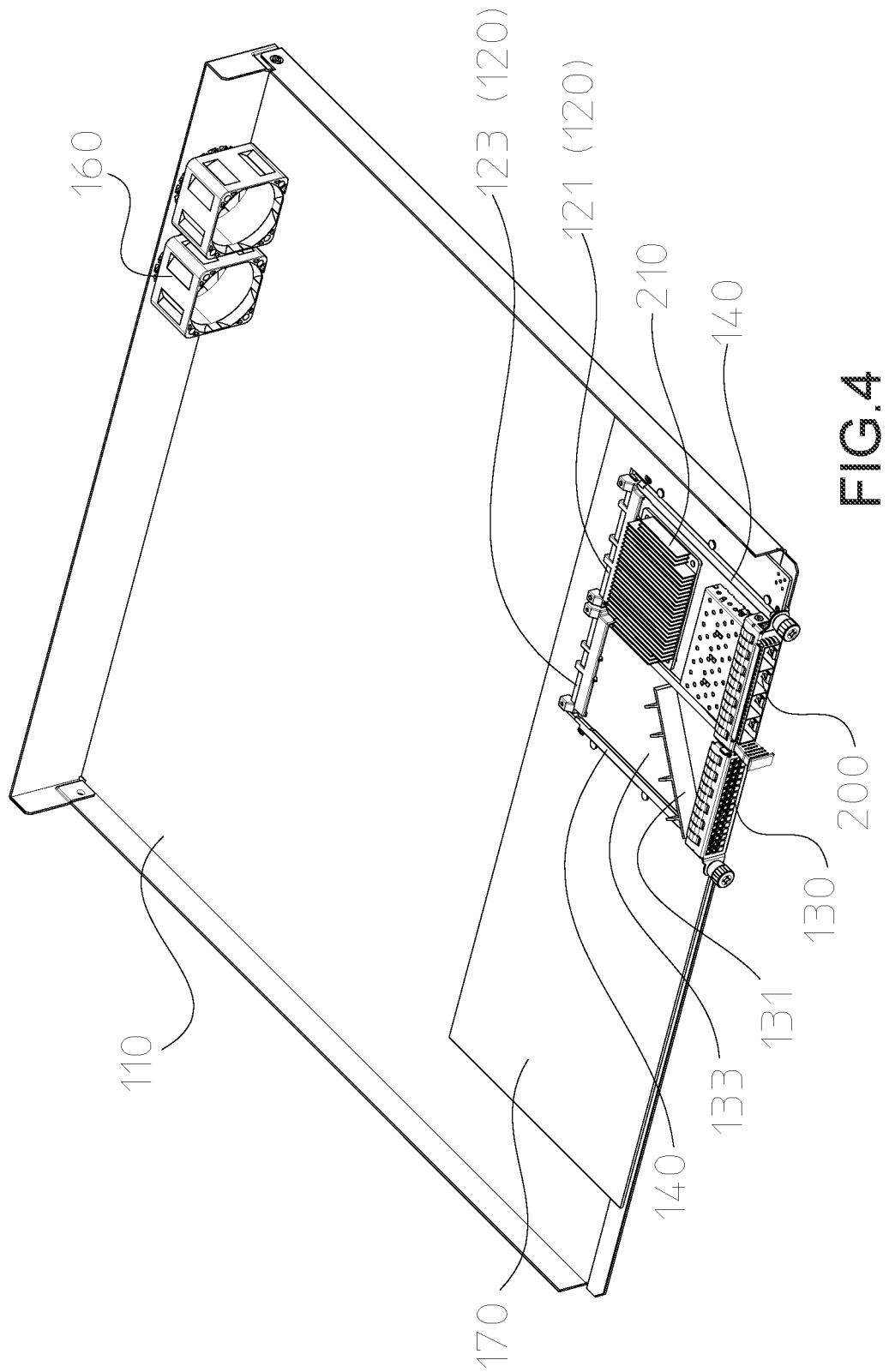
FIG. 4 is a schematic diagram of an electronic device in a first mode according to an embodiment of the present disclosure.
Figure 5:
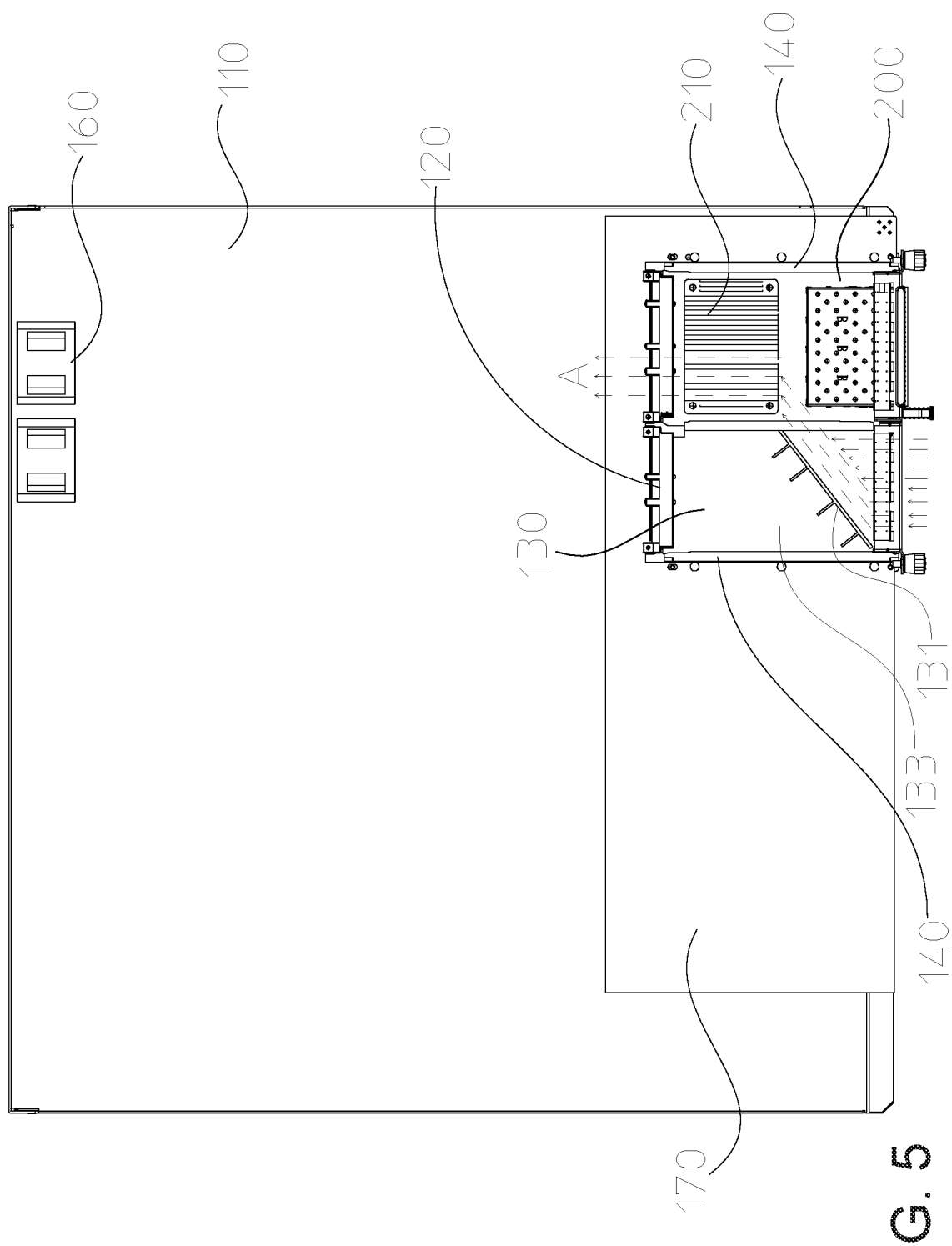
FIG. 5 is a top view of an electronic device in a first mode according to an embodiment of the present disclosure.

Referring to FIG. 4, when the electronic device 100 is in the first mode, the adaptor card 130 is disposed between the insertion slot 111 and the connecting interface 120, and the first electronic module 200 is placed in the electronic device 100 by entering through the insertion slot 111 and approaching the connecting interface 120 along the guiding rails 140 until being connected to the first connecting part 121. And hence, the installation of the first electronic module 200 is completed. More specifically, the adaptor card 130 is positioned between the insertion slot 111 and the second connecting part 123, and the connecting end 240 of the first electronic module 200 is connected to the first connecting part 121. As shown in FIG. 5, the relative position of the adaptor card 130 and the first electronic module 200 is side-by-side, which allows the flow guide 131 to direct an airflow A toward the first electronic module 200 and the heat to be dissipated through the heat dissipation unit 210 of the first electronic module 200 and the fan 160 of the electronic device 100, and thereby lowering the temperature of the first electronic module 200 during operation.

Figure 6A:
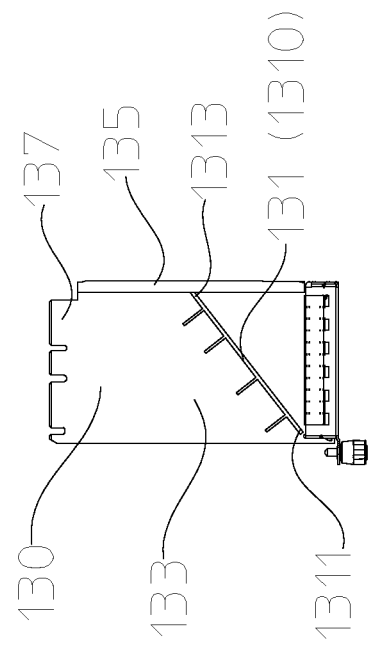
FIG. 6A is a schematic diagram of an adaptor card according to an embodiment of the present disclosure.
Figure 6B:
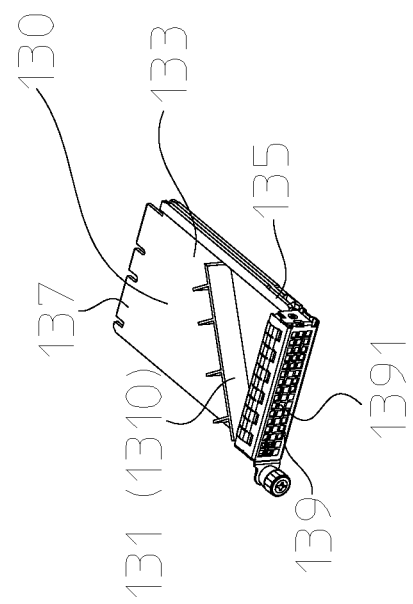
FIG. 6B is a top view of an adaptor card according to an embodiment of the present disclosure.
Figure 7B:
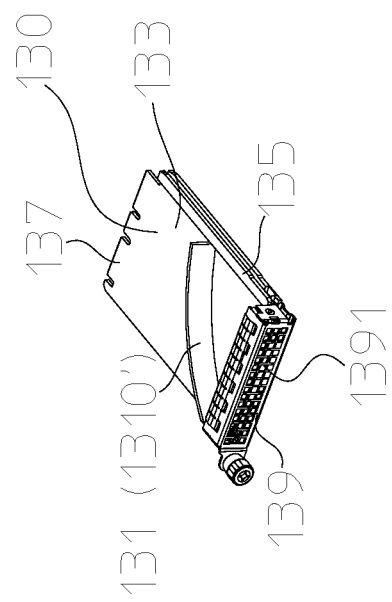
FIG. 7B is a top view of an adaptor card according to another embodiment of the present disclosure.
Figure 7A:
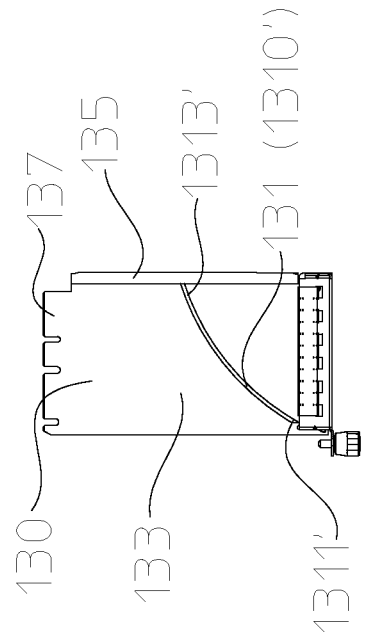
FIG. 7A is a schematic diagram of an adaptor card according to another embodiment of the present disclosure.

Referring to FIGS. 6A and 6B, the adaptor card 130 includes a card body 133 and a flow guide 131 disposed on one surface of the card body 133. The flow guide 131 is designed and configured to have a structure capable of directing airflow. In one embodiment, the flow guide is a baffle 1310 which extends from one side of the card body 133 to another side of the card body 133. In this embodiment, the baffle 1310 extends between two opposite sides of the card body 133, but the present disclosure is not limited thereto, the baffle 1310 can also extend between two adjacent sides of the card body 133. Furthermore, when the baffle 1310 is straight as shown in FIGS. 6A and 6B, the baffle 1310 is preferably disposed diagonally on the card body 133; in other words, a long side of the baffle 1310 is not parallel nor perpendicular to any side of the card body 133, so as to better direct the airflow A. When the baffle 1310' is curved as shown in FIGS. 7A and 7B, the baffle 1310' is preferably disposed such that its opening faces toward the insertion slot 111 and the first electronic module 200 at the same time, so as to direct the airflow A from the insertion slot 111 to the first electronic module 200. Specifically, in the first mode, a first end 1311, 1311' of the baffle 1310, 1310' is close to the insertion slot 111, and a second end 1313, 1313' of the baffle 1310, 1310' is close to the heat dissipation unit 210 of the first electronic module 200.

It is to be noted that the aforementioned baffle types are merely for illustrative purpose and the structural design and type of the flow guide 131 of the adaptor card 130 of the present disclosure is not limited thereby, as long as the flow guide 131 is capable of directing airflow. The flow guide 131 can be secured to the card body 133 through means of adhesive, engagement, fastening, fitting, etc. or can be integrally formed with the card body 133, the present disclosure is not limited thereto.

In one embodiment, the adaptor card 130 includes a dummy connecting part 137 disposed at one end of the card body 133 for connecting to the connecting interface 120, wherein the dummy connecting part 137 has a specific shape corresponding to the second connecting part 123, and the connection between the dummy connecting part 137 and the second connecting part 123 can assist in positioning the adaptor card 130. Thus, in the first mode, the first connecting part 121 and the second connecting part 123 of the connecting interface 120 connect respectively to the first electronic module 200 and the adaptor card 130.

In one embodiment, the adaptor card 130 further includes a cover part 139 disposed at the other end of the card body 133, opposite to the dummy connecting part 137, for covering a portion of the insertion slot 111. The cover part 139 has a plurality of through holes 1391 for the airflow A to pass through. As shown in FIG. 5, the airflow A enters the housing 110 through the through holes 1391, moves toward the heat source of the first electronic module 200 along the flow guide 131, and then passes through the heat dissipation unit 210 of the first electronic module 200. As such, air in the housing 110 is circulated, and heat is dispersed, thereby achieving better heat dissipation effect on the first electronic module 200 and further lowering the temperature of the electronic device 100.

In one embodiment, the adaptor card 130 further includes a rail structure 135 disposed on one side of the card body 133 for assisting the insertion of the first electronic module 200 into the electronic device 100.

Referring to FIGS. 6A and 6B, when the flow guide 131 is the straight baffle 1310, the first end 1311 of the baffle 1310 is configured to be near the one end of the card body 133 where the cover part 139 is disposed, and the second end 1313 of the baffle 1310 is configured to be near the one side of the card body 133 where the rail structure 135 is disposed.

Referring to FIGS. 7A and 7B, when the flow guide 131 is the curved baffle 1310', the first end 1311' and the second end 1313' of the baffle 1310' are respectively configured to be in close proximity to the one end of the card body 133 where the cover part 139 is disposed and the one side of the card body 133 where the rail structure 135 is disposed, such that the opening of the curvature in the baffle 1310' faces the end of the card body 133 where the cover part 139 is disposed and the side of the card body 133 where the rail structure is disposed.

In short, the baffle 1310, 1310' extends from one side of the adaptor card 130 to another side of the adaptor card 130 for blocking the airflow A, which enters through the insertion slot 111, from flowing to the dummy connecting part 137 and for directing the airflow A toward the heat dissipation unit 210 of the first electronic module 200. In other words, when the electronic device 100 is in the first mode and the adaptor card 130 and the first electronic module 200 are placed side by side, one end of the baffle 1310, 1310' is adjacent to the insertion slot 111, and the other end of the baffle 1310, 1310' is adjacent to the heat dissipation unit 210.

There are two ways to insert the first electronic module 200 into the electronic device 100, namely, the adaptor card 130 and the first electronic module 200 can be assembled by two processes so as to put the electronic device 100 in the first mode.

Figure 8A:
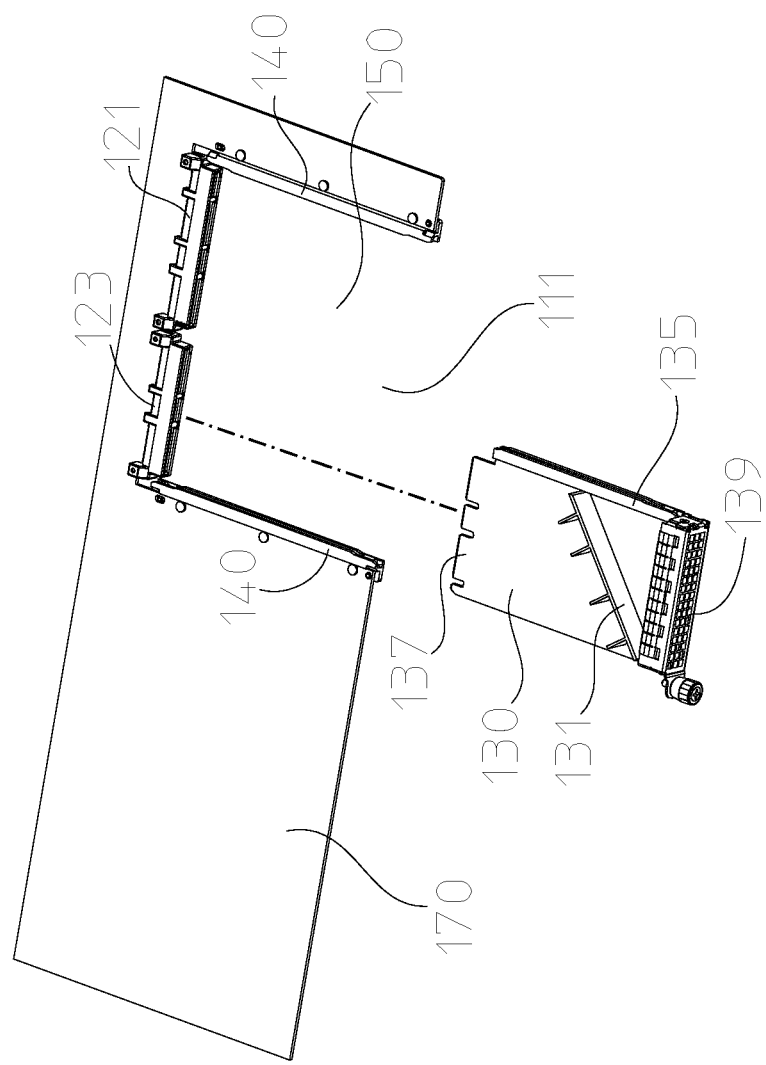
FIG. 8A and FIG. 8B are schematic diagrams of a first electronic module being placed in an electronic device according to an embodiment of the present disclosure.
Figure 8B:
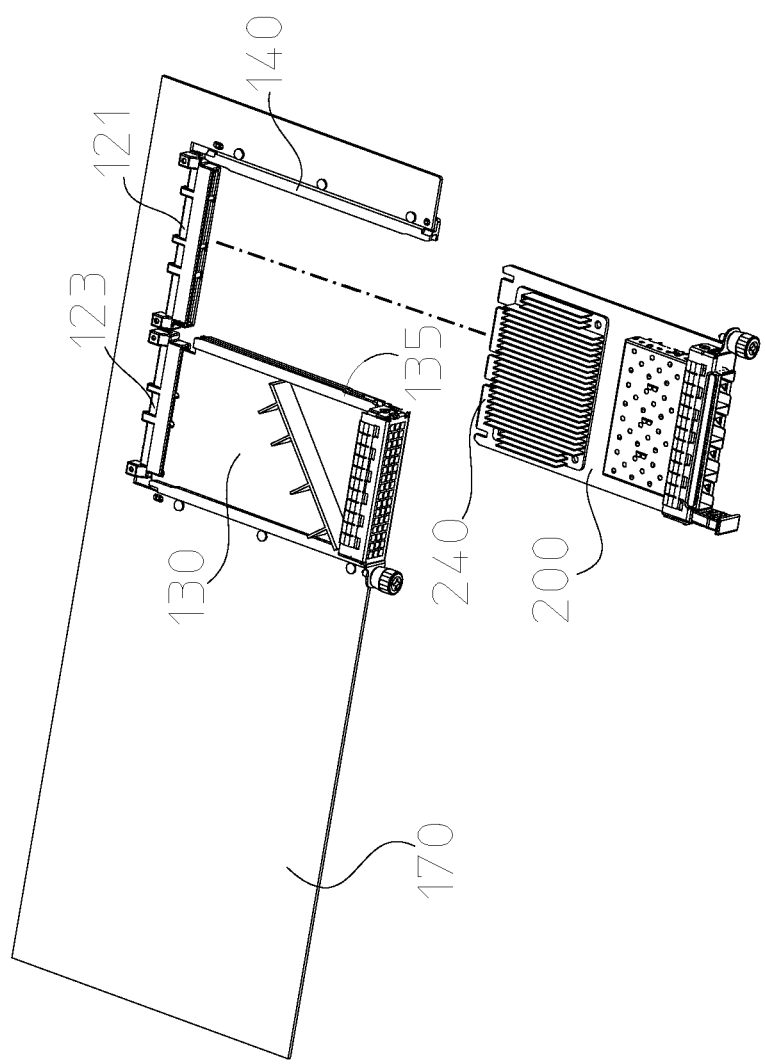

Referring to FIGS. 8A and 8B, in the first process, the adaptor card 130 is placed, in an orientation of the dummy connecting part 137 facing toward the housing 110 and the cover part 139 facing away from the housing 110, in the housing 110 by entering through the insertion slot 111 and moving along the guiding rail 140 on one side of the insertion slot 111 until the dummy connecting part 137 connects to the second connecting part 123 or until the adaptor card 130 is installed at a designated position. Next, the first electronic module 200 is placed in the housing 110 by entering through the insertion slot 111 and moving along the guiding rail 140 on the other side of the insertion slot 111 and the rail structure 135 of the adaptor card 130 until the connecting end 240 connects to the first connecting part 121. Thus, the adaptor card 130 and the first electronic module 200 are both installed in the accommodating space 150 of the electronic device 100 as shown in FIGS. 4 and 5, and the electronic device 100 is put in the first mode.

Figure 9:
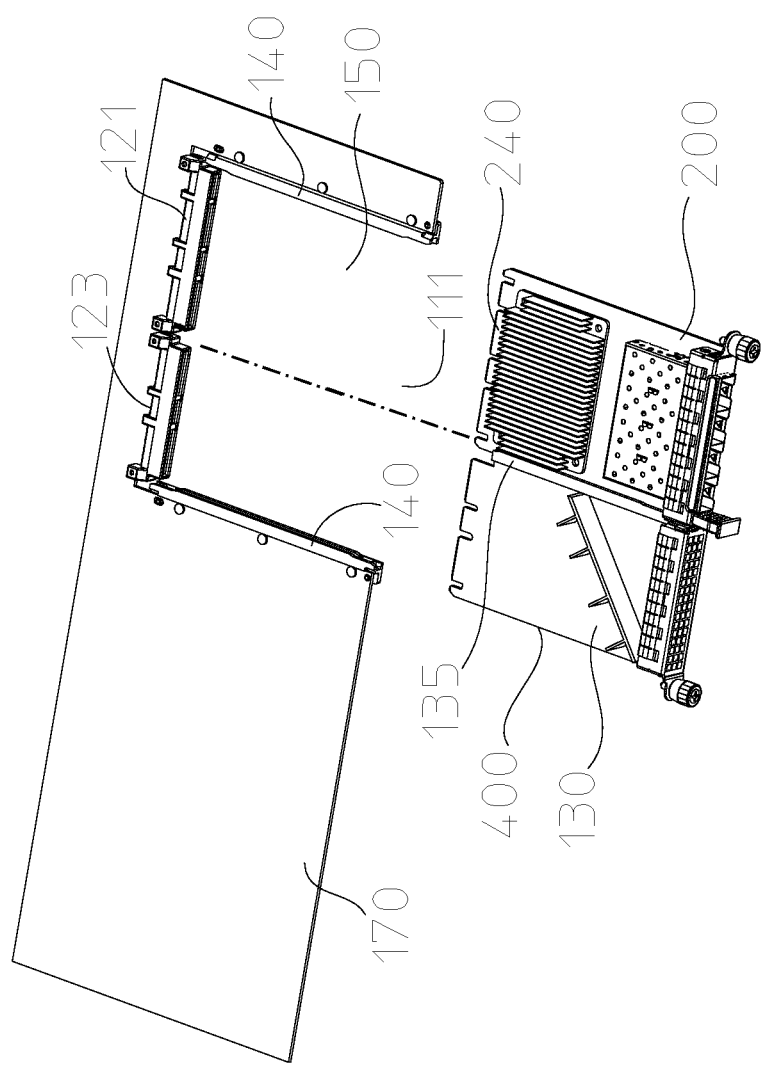
FIG. 9 is a schematic diagram of a first electronic module being placed in an electronic device according to another embodiment of the present disclosure.

Referring to FIG. 9, in the second process, the first electronic module 200 is assembled with the adaptor card 130 through the rail structure 135 to form an assembled card 400 first, and then the assembled card 400 is placed in the housing 110 through the insertion slot 111 and along the two guiding rails 140 on the two sides of the insertion slot 111 until the connecting end 240 of the first electronic module 200 connects to the first connecting part 121. Thus, the adaptor card 130 and the first electronic module 200 are both installed in the accommodating space 150 of the electronic device 100 as shown in FIGS. 4 and 5, thereby putting the electronic device 100 in the first mode.

Figure 10:
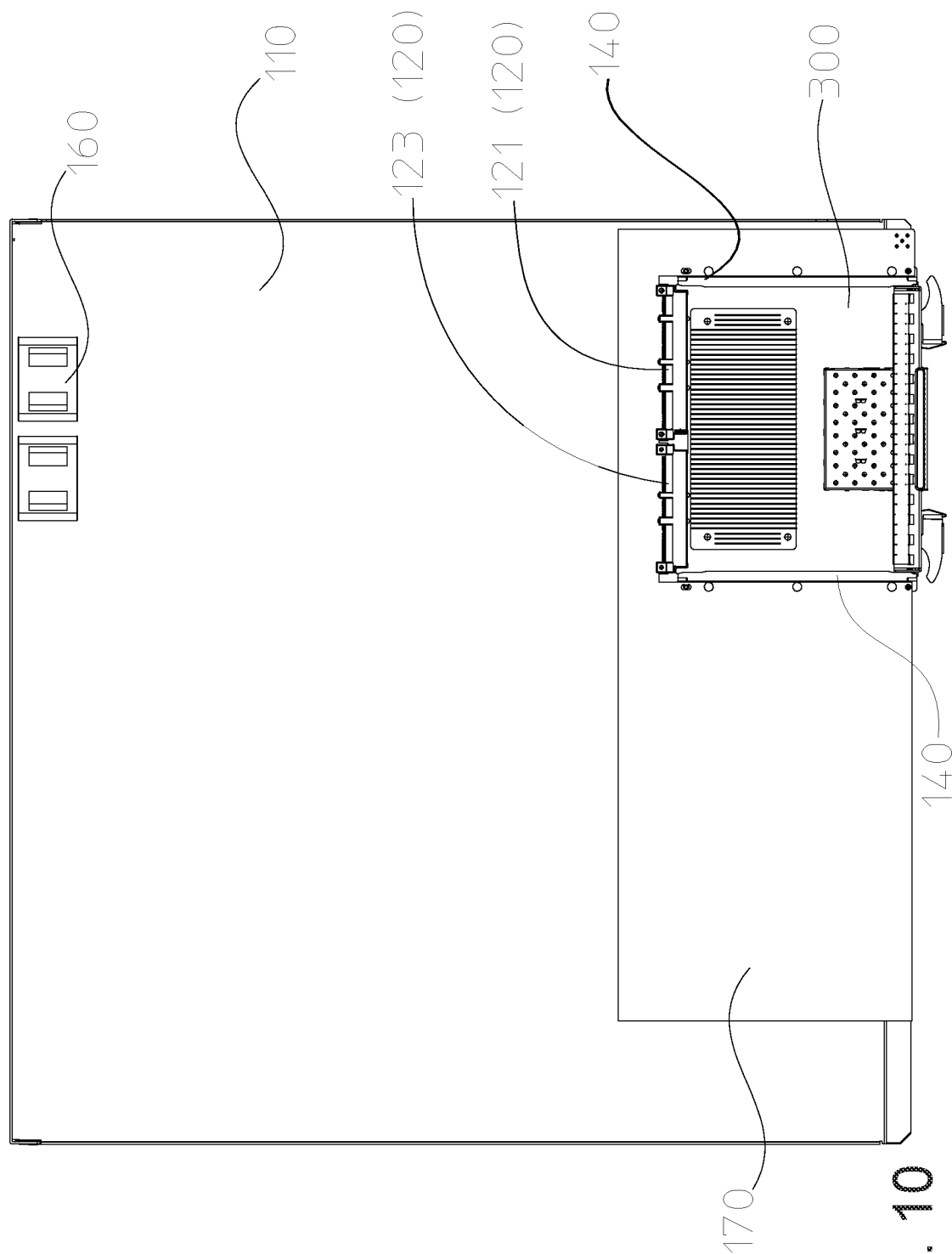
FIG. 10 is a top view of an electronic device in a second mode according to an embodiment of the present disclosure.

As shown in FIG. 10, the electronic device 100 is in the second mode when the adaptor card 130 is removed from the housing 110 and the second electronic module 300 is placed in the housing 110 through the insertion slot 111 and connected to the connecting interface 120. In particular, the adaptor card 130 is removed from the housing 110 through the insertion slot 111 first, and then the second electronic module 300 is placed in the housing 110 by entering through the insertion slot 111 and moving along the guiding rails 140 on the two sides of the insertion slot 111 until the connecting end 340 connects to the first connecting part 121 and the second connecting part 123. Hence, the accommodating space 150 of the electronic device 100 only has the second electronic module 300 installed therein and so the electronic device 100 is put in the second mode.

To put emphasis on the features of the present disclosure, the aforementioned embodiments are described mostly with the housing 110 of the electronic device 100 having one expansion slot, wherein the expansion slot refers to the accommodating space 150 formed by the insertion slot 111, the guiding rails 140, and the connecting interface 120, but the present disclosure does not limit the amount of expansion slots in the electronic device 100. The electronic device 100 may have a plurality of expansion slots, wherein the plurality of expansion slots may be arranged in an up-down stacked manner as shown in FIG. 1B or in a left-right side by side manner (not illustrated), so that the electronic device 100 can be in the first mode and the second mode at the same time as shown in FIG. 1A.

The electronic device 100 can be, for example but not limited to, a router, a switch, or a server, which further includes other electronic components in the housing 110 for providing supposed functions of the electronic device 100. The electronic modules 200, 300 can be, for example but not limited to, network interface modules (NIM), wherein the first electronic module 200 is an SFF NIM, and the second electronic module 300 is a LFF NIM. The connecting interface can be, for example but not limited to, a PCIe connector slot, wherein the first connecting part 121 is one PCIe connector slot, and the second connecting part 123 is another PCIe connector slot, which means the connecting interface 120 has two PCIe connector slots.

Through the adaptor card provided by the present disclosure, electronic modules of different sizes can be easily inserted into the existing expansion slot of the electronic device and installed properly, and at the same time, the flow guide on the adaptor card can improve the heat dissipation effect of the electronic module, thereby lowering the temperature of the electronic module during operation. Hence, users are able to select the electronic module according to their needs without being limited by the existing expansion slot of the electronic device and the goal of expanding the flexibility in user selection is met.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device comprising:
   a housing, comprising an insertion slot;
   a connecting interface, disposed in the housing for connecting to a first electronic module or a second electronic module separately, the connecting interface comprising a first connecting part and a second connecting part; and
   an adaptor card, detachably disposed in the housing and comprising a flow guide;
   wherein, when the electronic device is in a first mode, the first electronic module is disposed in the housing through the insertion slot and connects to the first connecting part, and the adaptor card is disposed between the insertion slot and the second connecting part such that the flow guide directs an airflow toward the first electronic module; and
   when the electronic device is in a second mode, the adaptor card is removed from the housing through the insertion slot, and the second electronic module is disposed in the housing through the insertion slot and connects to the first connecting part and the second connecting part,
   wherein the adaptor card further comprises a dummy connecting part, and when the electronic device is in the first mode, the dummy connecting part connects to the second connecting part.

2. The electronic device according to claim 1, wherein the flow guide is a baffle extending from one side of the adaptor card to another side of the adaptor card for blocking the airflow entering through the insertion slot to the dummy connecting part.

3. The electronic device according to claim 2, wherein the first electronic module comprises a heat dissipation unit, and when the electronic device is in the first mode, the adaptor card and the first electronic module are disposed side by side, with one end of the baffle close to the insertion slot and another end of the baffle close to the heat dissipation unit, for directing the airflow from the insertion slot to the heat dissipation unit.

4. The electronic device according to claim 1, further comprising two guiding rails respectively disposed on two sides of the insertion slot and extending toward the connecting interface.

5. An adaptor card, suitable for use in an electronic device comprising an insertion slot and a connecting interface, the adaptor card comprising:
   a card body; and
   a flow guide, disposed on the card body;
   wherein the adaptor card enters the electronic device through the insertion slot, and the flow guide directs an airflow toward an electronic module disposed in the electronic device through the insertion slot and connected to the connecting interface,
   wherein the adaptor card further comprises:
   a dummy connecting part, disposed at one end of the card body for connecting to the connecting interface; and
   a cover part, disposed at another end of the card body and comprising a plurality of through holes for the airflow to pass through.

6. The adaptor card according to claim 5, further comprising a rail structure disposed on one side of the card body.

7. The adaptor card according to claim 6, wherein the flow guide is a baffle, one end of the baffle is close to the side of the card body where the rail structure is disposed, and another end of the baffle is close to the end of the card body where the cover part is disposed.

8. The adaptor card according to claim 7, wherein the baffle is curved, and an opening of the curved baffle faces the side of the card body where the rail structure is disposed and the end of the card body where the cover part is disposed.

* * * * *